United States Patent [19]

Ishikawa et al.

[11] Patent Number: 5,363,340
[45] Date of Patent: Nov. 8, 1994

[54] SEMICONDUCTOR MEMORY

[75] Inventors: Kimiyasu Ishikawa; Kiyokazu Hashimoto, both of Tokyo, Japan

[73] Assignee: NEC Corporation, Tokyo, Japan

[21] Appl. No.: 937,390

[22] Filed: Aug. 31, 1992

[30] Foreign Application Priority Data

Aug. 29, 1991 [JP] Japan .................. 3-245180

[51] Int. Cl.$^5$ ............. G11C 7/02; G11C 7/00
[52] U.S. Cl. ................. 365/233.5; 365/189.09; 365/207; 365/226; 365/104
[58] Field of Search ......... 365/233.5, 189.09, 104, 365/185, 226, 207, 208

[56] References Cited

U.S. PATENT DOCUMENTS

| | | | |
|---|---|---|---|
| 5,022,003 | 6/1991 | Kohno | 365/226 |
| 5,056,063 | 10/1991 | Santin et al. | 365/208 |
| 5,132,937 | 7/1992 | Tuda et al. | 365/233.5 |

*Primary Examiner*—Eugene R. LaRoche
*Assistant Examiner*—Huan Hoang
*Attorney, Agent, or Firm*—Sughrue, Mion, Zinn, Macpeak & Seas

[57] ABSTRACT

A semiconductor memory whose sense amplifier having a bias circuit and a charging circuit is provided. The bias circuit includes a first MOSFET whose source is connected to a digit line, a second MOSFET provided between a power source and the first MOSFET and becoming a load of the first MOSFET, and a first inverter whose input terminal and output terminal are connected respectively to the source and gate of the first MOSFET. The charging circuit includes a third MOSFET whose source is connected to the source of the first MOSFET, a second inverter whose input terminal and output terminal are connected respectively to the source and gate of the third MOSFET, and a fourth MOSFET provided between the drain of the third MOSFET and the power source and receiving through the gate thereof an output signal of an address transition detector which detects an address change and generates a pulse signal. The source of the first MOSFET is made an input terminal and a connecting point of the first MOSFET and a second MOSFET is made an output terminal of the sense amplifier. The potential amplitude of an output signal of the sense amplifier is same as that of the conventional one, so that the sense amplifier can be operated speedily and stably when a selected digit line due to address change is charged.

11 Claims, 6 Drawing Sheets

SEMICONDUCTOR MEMORY

BACKGROUND OF THE INVENTION

1. Field of the Invention

This invention relates to a semiconductor memory and more particularly, to a semiconductor memory having a sense amplifier which has a metal oxide semiconductor field effect transistor (MOSFET) as the main component and makes fast access possible.

2. Description of the Related Art

FIG. 1 is a block diagram of a conventional semiconductor memory having MOSFETs as the main component, and FIG. 2 is a circuit diagram showing a concrete example of the memory shown in FIG. 1.

With the conventional semiconductor memory as shown in FIGS. 1 and 2, a signal COJ from a memory cell block 4 is amplified by a sense amplifier 1 and sent to a differential amplifier 2 as an output signal SA. On the other hand, the differential amplifier 2 receives a reference signal RA from a reference amplifier 3. The differential amplifier 2 amplifies a difference signal between the output signal SA and reference signal RA and outputs it as a signal OUT1.

The sense amplifier 1 comprises, as shown in FIG. 2, an N-channel MOSFET Q1, a P-channel MOSFET Q2 which serves to operate as a load of the MOSFET Q1 and an inverter INV1. The N-channel MOSFET Q1 has the drain connected to an output end 1b of the sense amplifier 1 and the source connected to an input end 1a of the sense amplifier 1. To the drain of the MOSFET Q1, a power source voltage Vcc is supplied through the MOSFET Q2. The inverter INV1 has an input end connected to the input end 1a and an output end connected to the gate of the MOSFET Q1. To the source of the P-channel MOSFET Q2, the power source voltage Vcc is supplied through a power source end 1c. The gate and drain of the MOSFET Q2 are connected in common to the output end 1b. The sense amplifier 1 receives the input signal COJ from the memory cell block 4 through the input end 1a and sends the output signal SA through the output end 1b to the differential amplifier 2.

AN N-channel MOSFET MY1 is connected between the input end 1a of the sense amplifier 1 and a point 8 for connection to a digit line (a row line). The N-channel MOSFET MY1 is a Y-selector. Connected between the connecting point 8 and the ground G, is an N-channel enhancement MOSFET MB1 and an N-channel depletion MOSFET MB2, which are block decoders, and one memory cell block 4 connected in series.

The memory cell block 4 has 15 N-channel enhancement MOSFETs M1 to M15 and one depletion MOSFET M16 connected in series with each other. Each of these 16 MOSFETs M1 to M16 makes a memory cell. Though not shown here, a plurality of memory cell blocks, sense amplifiers and other related elements each having the same structure as in FIG. 2 are provided.

The sense amplifier 1 outputs one of different electric potentials Von and Voff as the output signal SA through the output end 1b to the differential amplifier 2 in accordance with whether a selected memory cell is in the conduction or non-conduction state.

Next, the operation of the sense amplifier 1 will be explained below.

If a selected memory cell of the memory cells M1 to M16 is under the conduction state, that is, for example, if a signal line Y1 connected to the MOSFET MY1 of the Y-selector, a signal line XB1 connected to the MOSFET MB1 of the block decoder and signal lines X1 to X15 connected respectively to the memory cells M1 to M15 are made at high levels and a signal line XB2 connected to the MOSFET MB2 of the block decoder and a signal line X16 connected to the memory cell 16 are made at low levels, the sense amplifier 1 sends a low level voltage Von to the differential amplifier 2 as the output signal SA.

The operation in this case is as follows; If the selected memory cell is in the conduction state, an electric current flows to the ground G and the electric potential of the input end 1a of the sense amplifier 1 is gradually lowered due to discharging. When the electric potential of the input end 1a becomes lower than the theoretical threshold voltage of the inverter INV1, the output of the inverter INV1 is switched from the low level to the high level, and the MOSFET Q1 is switched from the non-conduction state to the conduction state. As a result, the electric potential of the output end 1b of the sense amplifier 1 is switched from the high level to the low level, so that the sense amplifier 1 sends the low level potential Von to the differential amplifier 2 as the output signal SA. On the other hand, if the selected memory cell is under the non-conduction state, that is for example, if the signal lines Y1, XB1, X1 to X14 and X16 are made at high levels and the signal lines XB2 and X15 are made at low levels, the sense amplifier 1 sends the high level potential Voff to the differential amplifier 2 as the output signal SA.

The operation in this case is as follows; When the selected memory cell is in the non-conduction state, the electric potential of the input end 1a is at the low level, so that the MOSFET Q1 enters the conduction state by the operation of the inverter INV1. As a result, the connecting point 8 of the digit line is charged by the MOSFET Q2 through the MOSFET Q1 and MOSFET MY1. Accordingly, if an electric potential SD of the input end 1a is increased to exceed the theoretical threshold voltage of the inverter INV1, the output signal of the inverter INV1 is switched from the high level to the low level, and the MOSFET Q1 enters the non-conduction state. Therefore, the electric potential of the output end 1b of the sense amplifier 1 is charged by the MOSFET Q2 to the high level, and the high level potential Voff is sent to the differential amplifier 2 as the output signal SA from the sense amplifier 1.

Here, if the power source voltage is expressed as Vcc, and the threshold voltage of the MOSFET Q2 is expressed as VTP, the high level potential Voff can be obtained as;

$$Voff = Vcc - VTP \tag{1}$$

As shown above, the sense amplifier 1 detects that the selected memory cell is in the conduction state or non-conduction state, and sends the potential Von or Voff, which is different in level from each other, as its output signal SA to the differential amplifier 2 in accordance with the state thus detected. The reference amplifier 3 sends the reference voltage Vref, which is set at a value between the potentials Von and Voff, to the differential amplifier 2 as its output signal RA. The differential amplifier 2 outputs the difference between the output signals SA and RA, namely, a signal OUT1 obtained by amplifying the potential difference between the signals Vref and Von or between the signals Vref and Voff.

FIG. 3 shows potential changes of respective components when a selected memory cell is changed from the conduction state to the non-conduction state due to the address change. If the selected memory cell is switched from the conduction state to non-conduction state, the electric potential SD of the connecting point 8 starts to be increased with a slight delay by charging, becoming a constant level soon. The output signal SA of the sense amplifier 1 is held at the low level potential Von for a short period of time and after lowered once, increased to the high level potential Voff. If the electric potential of the output signal SA exceeds the reference potential Vref, the output signal OUT1 of the differential amplifier 2 is changed from an electric potential of zero (low level) to the power source voltage Vcc (high level). In FIG. 3, also, a time t2 indicates a time interval from the time point when the selected memory cell is switched from the conduction state to the non-conduction state to the time point when the output signal OUT1 of the differential amplifier 2 starts to be risen.

However, as a practical semiconductor memory has memory cells arranged in a matrix pattern, the connecting point 8 of the row line or digit line is applied with load capacities such as the drain diffusion layer capacity and the like that respective memory cells have. Expressed by a numeric example, if the electric current supplying capacity of the P-channel MOSFET Q2 through the N-channel MOSFET Q1 is 0.2 mA in average, a load capacity applied to the connecting point 8 is 5 pF, and an electric potential of the input end 1a of the sense amplifier 1 when data are read out is 1 V, a time T1 to be taken for charging the electric potential of the connecting point 8 from 0 V to 1 V may be expressed as;

$$T1 = (5 \times 10^{-12} \times 1)/0.2 \times 10^{-3} \quad (2)$$
$$= 25 \text{ [nsec]}$$

With the conventional semiconductor memory shown above, in order to shorten a charging time T1, that is, in order to read out information speedily, for example, the mutual transconductance of the P-channel MOSFET Q2 may be enhanced. In this case, however, if doing as above, the potential amplitude between the low and high level potentials Von and Voff of the output signal SA of the sense amplifier 1 will become small, resulting in a problem that the detection of information becomes difficult.

In addition, if the power source voltage Vcc is lowered, the electric current supplying capacity of the P-channel MOSFET Q2 is reduced and the operation speed will be decreased. As a result, if the mutual transconductance of the P-channel MOSFET Q2 intends to be enhanced in order to compensate the speed-down, the detection of information is disadvantageously difficult as shown above.

Thus, an object of this invention is to provide a semiconductor memory in which the operation when the digit line is charged due to address change can be performed speedily and stably as well as the operated speedily even when a power source voltage is low.

SUMMARY OF THE INVENTION

A semiconductor memory of this invention has a digit line, a plurality of memory cells connected to the digit line, and a sense amplifier for detecting an electric potential of the digit line changed in accordance with the information stored in these memory cells and amplifying the electric potential. The sense amplifier comprises a bias circuit and a charging circuit.

This bias circuit includes a first MOSFET whose source is connected to the digit line, a second MOSFET provided between a power source end and the first MOSFET and acting a load of the first MOSFET, and a first inverter having an input end and output end connected respectively to the source and gate of the first MOSFET.

The charging circuit includes a third MOSFET whose source is connected to the source of the first MOSFET, a second inverter whose input end and output end are connected respectively to the source and gate of the third MOSFET, and a fourth MOSFET provided between the power source end and the drain of the third MOSFET and receiving through its gate an output signal of an address transition detector which detects an address change to generate a pulse signal.

The source of the first MOSFET is made the input end of the sense amplifier and a connecting point of the first and second MOSFETs is made the output end thereof.

With the semiconductor memory of this invention, when a selected digit line is to be charged due to address change, the digit line is charged to both of the bias circuit including the first and second MOSFETs and the charging circuit including the third and fourth MOSFETs. Accordingly, the digit line can be charged more speedily than in a conventional semiconductor memory having only a circuit equivalent to the bias circuit.

The potential amplitude, that is, potential difference between a low level signal and a high level signal of the sense amplifier is equal to a conventional one, so that there is no difficulty to detect information, resulting in a stable operation. When the power source voltage is low, the electric current supplying capacity of the bias circuit is reduced, but it can be compensated by the electric current supplying capacity of the charging circuit, resulting in a high speed operation even in such case.

However, the fourth MOSFET is in the conduction state only when the output signal pulse of the address transition detector is under either of the logical states (high level or low level). As a result, in case that the time interval when the output of the address transition detector is in one logical state (for example, the high level), that is, the pulse width of the output signal thereof, is longer than or equal to the time interval until the electric potential of the input end of the sense amplifier is attained to the logical threshold voltage of the second inverter, the second inverter operates to switch the third MOSFET to the non-conduction state, so that the electric potential of the input end of the sense amplifier does not exceed the logical threshold voltage of the second inverter. Inversely, in case that the pulse width of the output signal of the address transition detector is shorter than the time interval until the electric potential of the input end thereof is attained to the logical threshold voltage of the second inverter, it is clearly recognized that the electric potential of the input signal of the sense amplifier does not exceed the logical threshold voltage of the second inverter. Therefore, operation of the sense amplifier is not adversely affected by the charging circuit.

The third MOSFET of the charging circuit may be different in input/output characteristics from the first MOSFET of the bias circuit, but preferably they are equal to each other. The second inverter of the charging circuit may be different in input/output characteristics from the second inverter of the bias circuit, but preferably they are equal to each other.

When the channel polarity of the fourth MOSFET is not matched with the logical state of the output signal of the address transition detector, a third inverter may be provided between the fourth MOSFET and address transition detector, and the logical state of the output signal of the address transition detector may be inverted therethrough to be inputted to the fourth MOSFET.

It is preferable that a voltage increasing circuit for increasing a power source voltage is provided and a first power source voltage is supplied to the bias circuit and a second power source voltage larger than the first power source voltage, which is obtained by the voltage increasing circuit, to the charging circuit. Consequently, the electric current supplying capacity of the charging circuit can be enhanced, and the operation speed can be advantageously improved as compared with the case when the same power source voltage is supplied.

DESCRIPTION OF THE PREFERRED EMBODIMENTS

Figure 1:
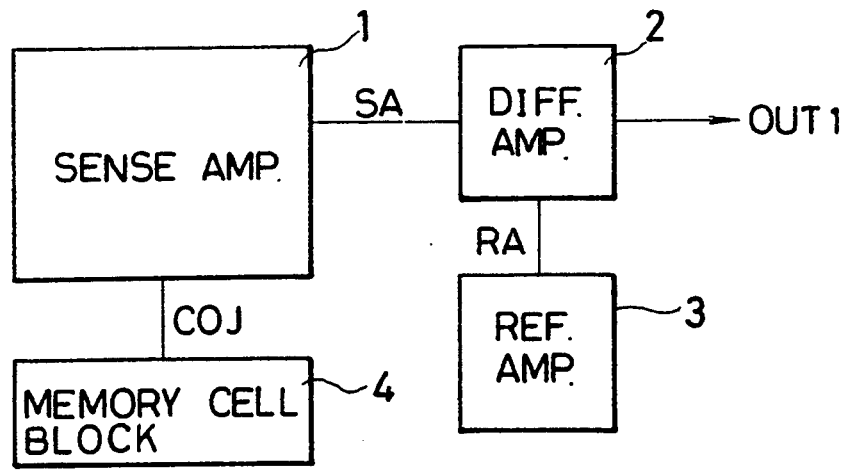
FIG. 1 is a block diagram of a conventional semiconductor memory.

Preferred embodiments of this invention will be described below while referring to the drawings attached.

Figure 2:
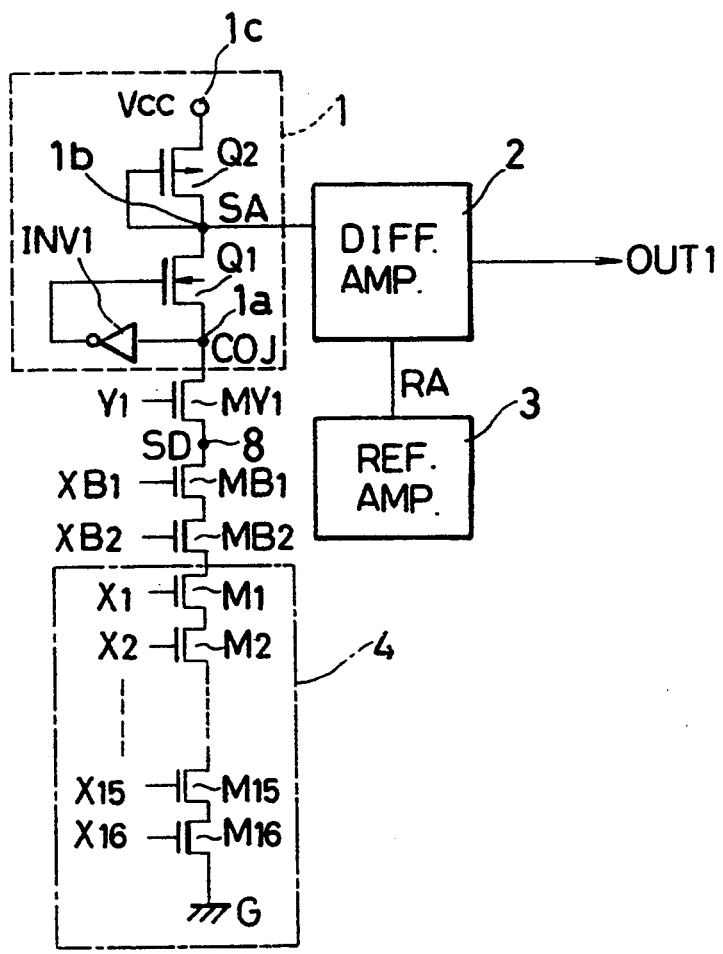
FIG. 2 is a detailed circuit diagram of the memory shown in FIG. 1.
Figure 3:
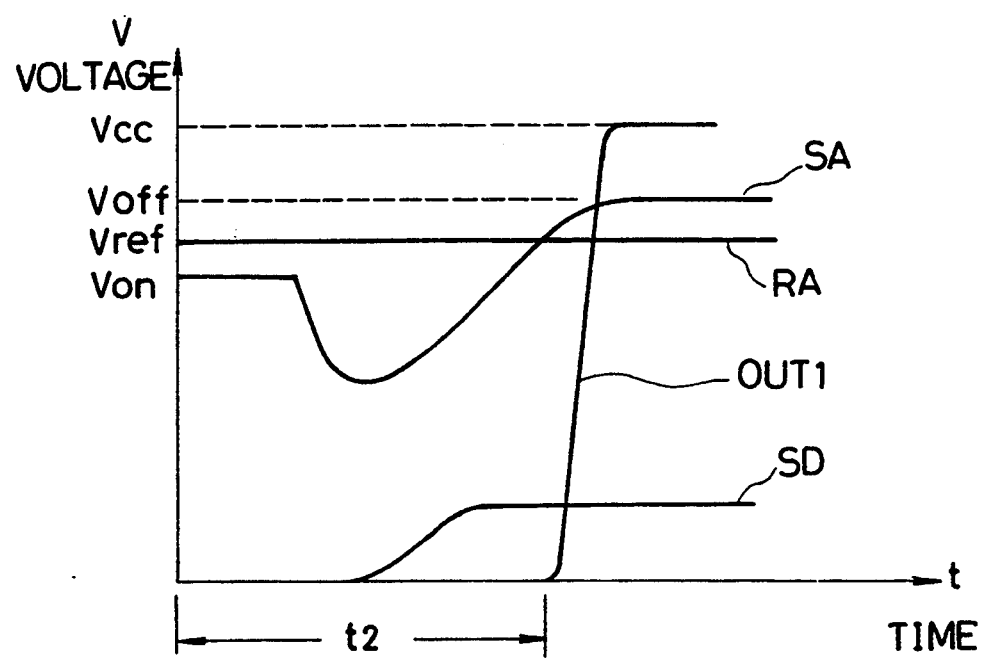
FIG. 3 is waveform diagrams of the memory shown in FIG. 1.
Figure 4:
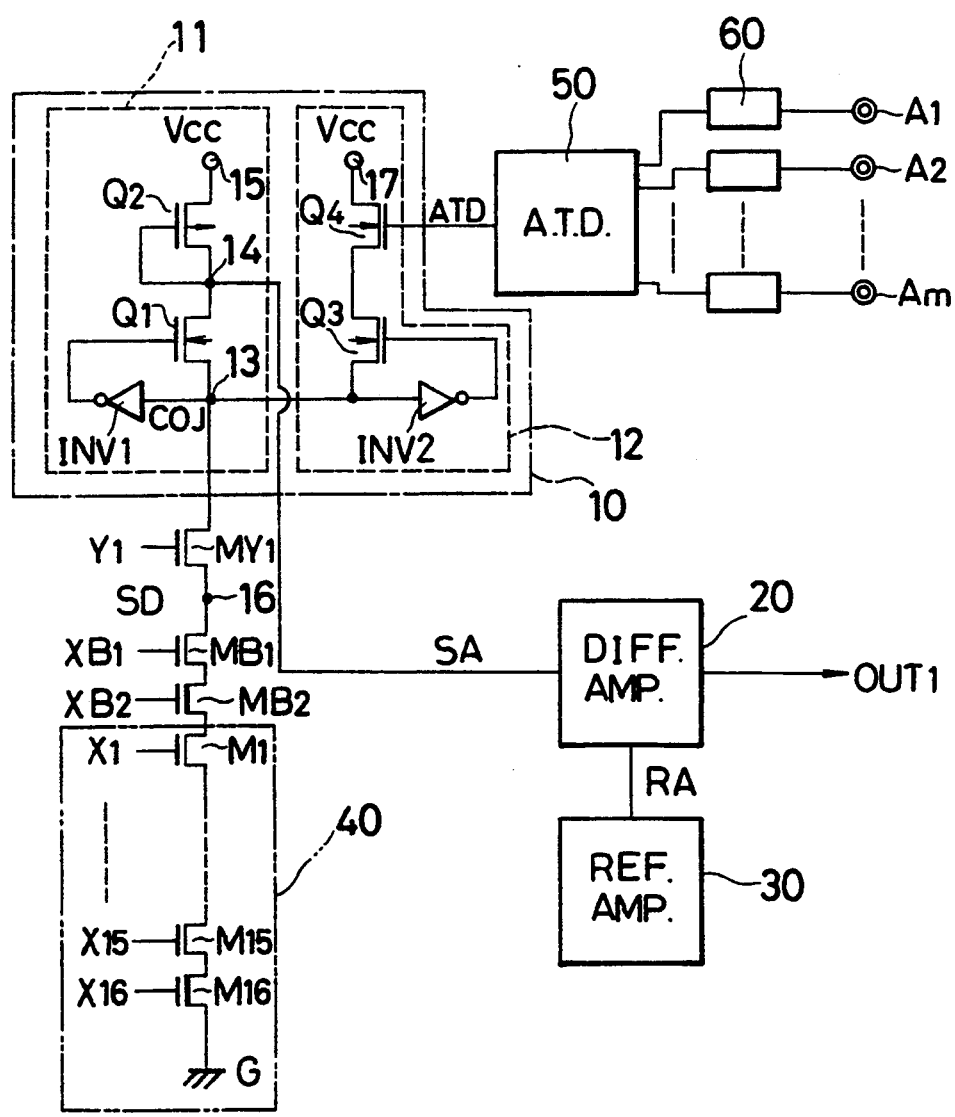
FIG. 4 is a circuit diagram of a semiconductor memory according to a first embodiment of this invention.

FIG. 4 shows a semiconductor memory according to a first embodiment of this invention, whose structure is basically equal to the conventional one shown in FIGS. 1 and 2. That is, the memory of this embodiment comprises a sense amplifier 10 for amplifying a signal COJ from a memory cell block 40, a reference amplifier 30 for generating a reference signal RA, and a differential amplifier 20 for amplifying a difference signal between the signal COJ from the sense amplifier 10 and the signal RA from the reference amplifier 30 and outputting an output signal OUT1.

The differential amplifier 20 and reference amplifier 30 have the same functions as those of the differential amplifier 2 and reference amplifier 3, shown in FIG. 2, respectively. The memory cell block 40 comprises, similar to the memory cell block 4 shown in FIG. 2, 15 N-channel enhancement MOSFETs M1 to M15 and one N-channel depletion MOSFET 16, thus 16 MOSFETs in total are connected in series.

Between an input end 13 of the sense amplifier 10 and a connecting point 16 with a row line (digit line) of block 40, an N-channel MOSFET MY1 of a Y-selector is provided, and between the row line (digit line) and the ground G, an N-channel enhancement MOSFET MB1 and an N-channel depletion MOSFET MB2, which are block decoders, and one memory cell block 40 are connected in series. The MOSFETs MB1 and MB2 and the memory cell block 40 are connected to the digit line. Though not shown in FIG. 4, a plurality of memory blocks being same in structure as the memory cell block 40 are arranged in a matrix pattern, and these plural memory blocks are connected to their digit line respectively.

An address transition detector 50 receives output signals of internal input pads A1 to Am through respective address buffer circuits 60 when at least one of the internal input pads A1 to Am is changed from the low level to the high level or vice versa due to address change and outputs a pulse signal corresponding to the address change from an output terminal ATD.

The sense amplifier 10 includes a bias circuit 11 and a charging circuit 12. The bias circuit 11 has the same structure as the sense amplifier 1 shown in FIG. 2. Namely, the bias circuit 11 comprises an N-channel MOSFET Q1, a P-channel MOSFET Q2 serving as a load of the MOSFET Q1, and an inverter INV1. The MOSFET Q1 has the drain connected to an output end 14 of the sense amplifier 1 and the source connected to an input end 13 thereof. The drain of the MOSFET Q1 is supplied with a power source voltage Vcc through the MOSFET Q2. The inverter INV1 has the input end connected to the input end 13 and the output end connected to the gate of the MOSFET Q1. The P-channel MOSFET Q2 has its source supplied with the power source voltage Vcc from the power source end 15 and its drain and gate are connected in common to the input end 13. The sense amplifier 10 receives through the input end 13 the input signal COJ from the memory cell block 40 and outputs the output signal SA from the output end 14 to the differential amplifier 20.

The charging circuit 12 comprises an N-channel MOSFET Q3 having the same input/output characteristics as those of the MOSFET Q1 of the bias circuit 11, an N-channel MOSFET Q4 having a threshold voltage nearly equal to the substrate voltage (VT_OV) which is smaller than that of the N-channel MOSFET Q2 of the bias circuit 11, and an inverter INV2 having the same input/output characteristics as those of the inverter INV1 of the bias circuit 11. The MOSFET Q3 has the drain supplied through the MOSFET Q4 with the power source voltage Vcc through the power source end 17, and the source connected to the input end 13 of the sense amplifier 10. The inverter INV2 has the input end connected to the input end 13 and the output end connected to the gate of the MOSFET Q3. The MOSFET Q4 has the source supplied through the power source end 17 with the power source voltage Vcc, the drain connected to the drain of the MOSFET Q3 and the gate supplied with an output signal ATD of the address transition detector 50.

Next, the operation of the semiconductor memory of this embodiment will be explained below.

When the row line is charged due to address change, that is, when one of the selected memory cells in the block 40 is switched from the conduction state to the non-conduction state due to address change, the connecting point 16 is, as in the sense amplifier 1 shown in FIG. 2, charged by the P-channel MOSFET Q2 and N-channel MOSFET Q1 of the bias circuit 11. At this time, the address transition detector 50 detects the address change and sends the high level output pulse ATD to the gate of the MOSFET Q4, so that the MOSFET Q4 enters the conduction state. Here, the MOSFET Q3 enters the conduction state by the operation of the inverter INV2, so that the connecting point 16 is also charged by the MOSFET Q3. As a result, as compared with the conventional one shown in FIG. 2, the charging of the connecting point 16, namely, the readout of information can be achieved more speedily.

The MOSFET Q4 enters the conduction state only when the output signal ATD of the address transition detector 50 is at the high level. If the time interval during which output signal ATD of the address transition detector 50 is being held at the high level is longer than the time until the electric potential of the input end 13 of the sense amplifier 10 reaches the logical threshold voltages of the inverters INV1 and INV2, the MOSFET Q1 is switched to the non-conduction state by the operation of the inverter INV1 and at the same time, the MOSFET Q3 is switched to the non-conduction state by the operation of the inverter INV2. Accordingly, the input end 13 of the sense amplifier 10 is never charged beyond the logical threshold value of the inverters INV1 and INV2.

As a result, even when the pulse width of the output signal ATD of the address transition detector 50 is longer than the time interval until the electric potential of the input end 13 of the sense amplifier 10 reaches the logical threshold voltages of the inverters INV1 and INV2, the sense amplifier 10 operates properly. Inversely, when the pulse width thereof is shorter than that time interval, it is clear that the input end 13 is not charged as to exceed the logical threshold voltages of the inverters INV1 and INV2, so that the sense amplifier 10 operates properly. As a result, the pulse width of the output signal ATD of the address transition detector 50 can be set to an arbitrary value.

Here, a numeric example of the charging rate will be shown below. For example, if the electric current supplying capacity through the P-channel MOSFET Q2 and N-channel MOSFET Q1 is 0.2 mA in average, the electric current supplying capacity through the N-channel MOSFET Q4 and N-channel MOSFET Q3 is 0.2 mA in average, the load capacity applied to the connecting point 16 of the digit line is 5 pF and the electric potential of the input terminal 13 of the sense amplifier 10 when data are read out is 1 V, the time T2 taken for charging the connecting point 16 of the digit line from 0 V to 1 V may be expressed as follows:

$$T2 = (5 \times 10^{-12} \times 1)/(0.2 \times 10^{-3} + 0.2 \times 10^{-3}) \quad (3)$$
$$= 12.5 \text{ [nsec]}$$

Comparing this with the charging time T1 of the conventional semiconductor memory (see Eq. (2)), the charging time T2 of this embodiment can be recognized to be halved. In addition, in spite of the fact that the charging time of the connecting point 16 can be halved as above, the amplitude between the low level potential Von and high level potential Voff of the output signal of the sense amplifier 10 becomes equal to that of the conventional semiconductor memory. This means that the memory of this embodiment can operate as stably as a conventional one.

When the power source voltage Vcc is low, the electric current supplying capacity of the P-channel MOSFET Q2 of the bias circuit 11 is reduced, but it can be compensated by the electric current supplying capacity of the N-channel MOSFET Q4 of the charging circuit 12 and as a result, even when the power source voltage is reduced, it can be operated speedily.

Figure 5:
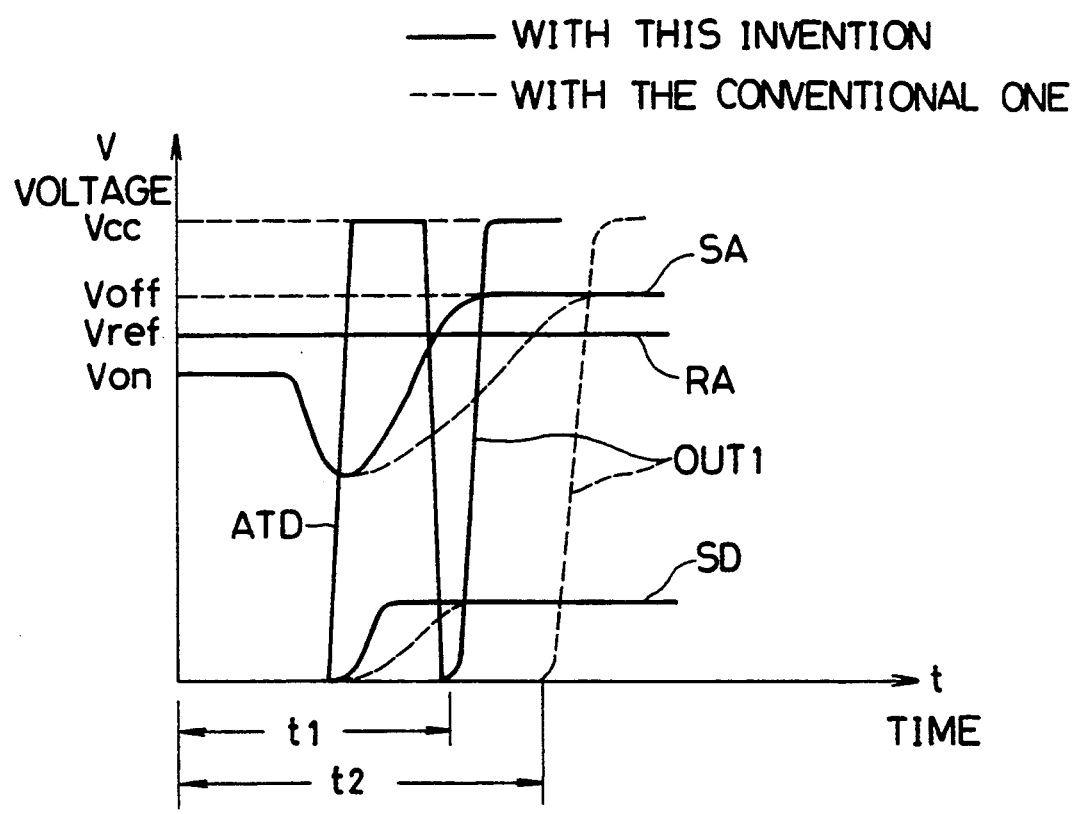
FIG. 5 is waveform diagrams of the memory shown in FIG. 4.

FIG. 5 are waveform diagrams of the memory in this embodiment, in which the abscissa indicates the time t and the ordinate the electric potential V. FIG. 5 shows the electric potential changes of respective components when the selected memory cell due to address change is changed from the conduction state to the non-conduction state. In FIG. 5, the continuous lines show the case of this embodiment and the broken lines show the case of the conventional one.

If the state of the memory cell is switched from conduction to non-conduction, the electric potential SD of the connecting point 16 starts to be increased with a slight delay by charging and soon reaches a constant level. In the memory of this embodiment, the electric potential of the connecting point 16 is charged speedily, so that the electric potential SD is more abruptly risen than that of the conventional one.

The output signal SA of the sense amplifier 10 is held at the low level potential Von for a short period of time, then once reduced and increased to the high level potential Voff. However, the connecting point 16 is charged speedily, so that the output signal SA is abruptly risen from the lowest level to become the high level potential Voff. Accompanied with this, the time when the output signal OUT1 of the differential amplifier 2 is changed from the potential of zero (low level) to the power source voltage Vcc high level) is advanced.

In FIG. 5, the times t1 and time t2 indicate the times from switching the conduction state to the non-conduction state to rising the output signal OUT1 of the differential amplifier 2, in the memory of this embodiment and the memory of the conventional one, respectively. The rising time t1 of the memory in this embodiment becomes shorter than the rising time t2 of that of the conventional one, which means that the memory of this embodiment can be operated faster than that of the conventional one.

Figure 6:
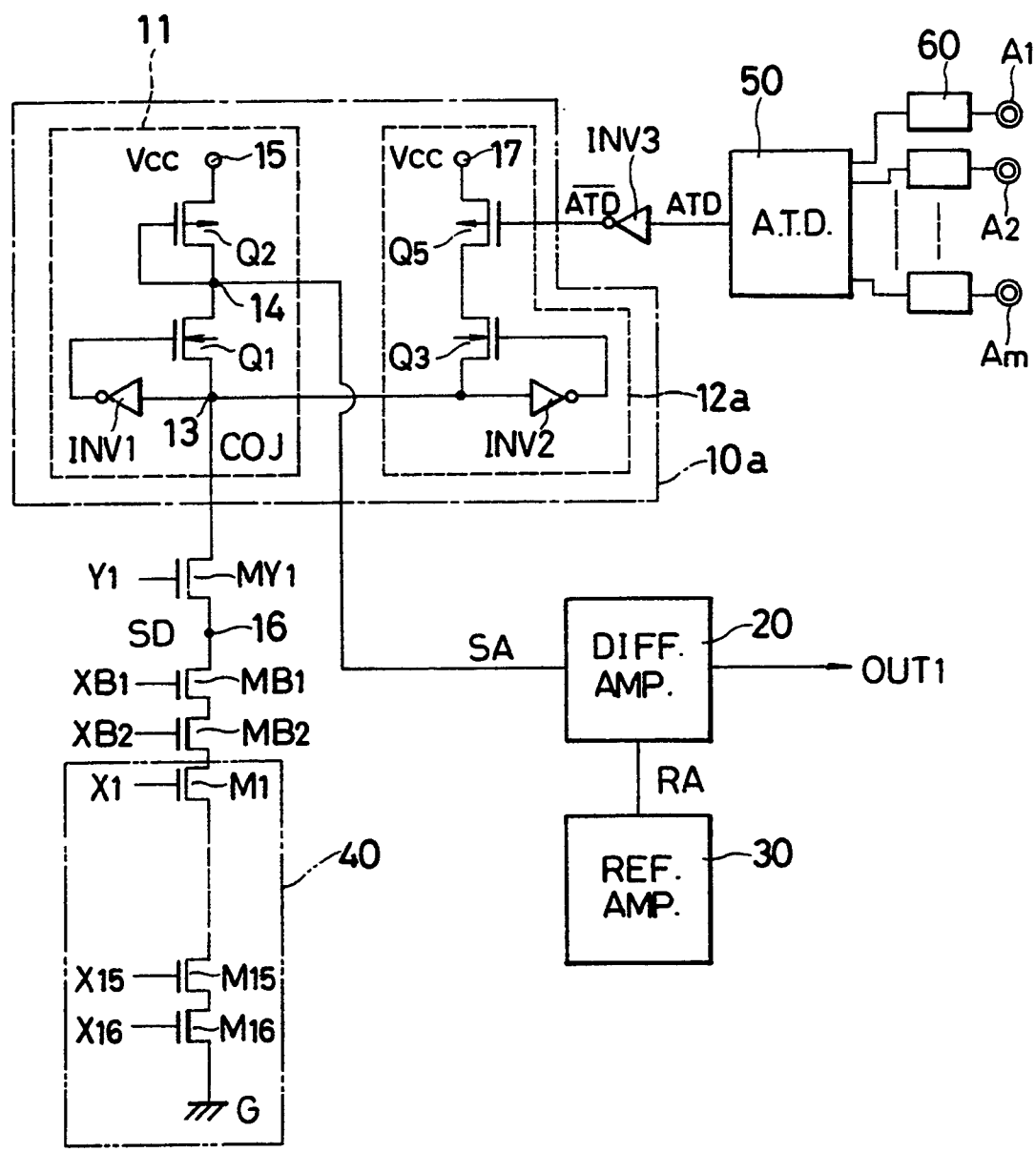
FIG. 6 is a circuit diagram of a semiconductor memory according to a second embodiment of this invention.

FIG. 6 is a circuit diagram of a semiconductor memory according to a second embodiment of this invention. In this embodiment, a sense amplifier 10a comprises a bias circuit 11 similar in structure to that in the first embodiment and a charging circuit 12a different in structure from that in the first embodiment. That is, the charging circuit 12a is different from the charging circuit 12 in the first embodiment in that the circuit 12a uses a P-channel MOSFET Q5 instead of the N-channel MOSFET Q4 in the first embodiment. Other than the sense amplifier 10a, what is different from the first embodiment is that an inverter INV3 is provided between an address transition detector 50 which is similar to that in the first embodiment and the MOSFET Q5. Other components are the same in structure as in the first embodiment.

The P-channel MOSFET Q5 has its source supplied through a power source end 17 with a power source voltage Vcc, its drain connected to the drain of an N-channel MOSFET Q3, and its gate supplied through the inverter INV3 with an output signal ATD of the address transition detector 50. The MOSFET Q5 has its gate supplied with a signal ATD obtained by inverting the polarity of the output signal ATD of the address transition detector 50.

The operation of the charging circuit 12a of this embodiment is the same as that of the first embodiment and as a result, the operation of the sense amplifier 10a is also the same as that of the first one. According to the second embodiment, the charging circuit can use a MOSFET different in channel polarity.

Figure 7:
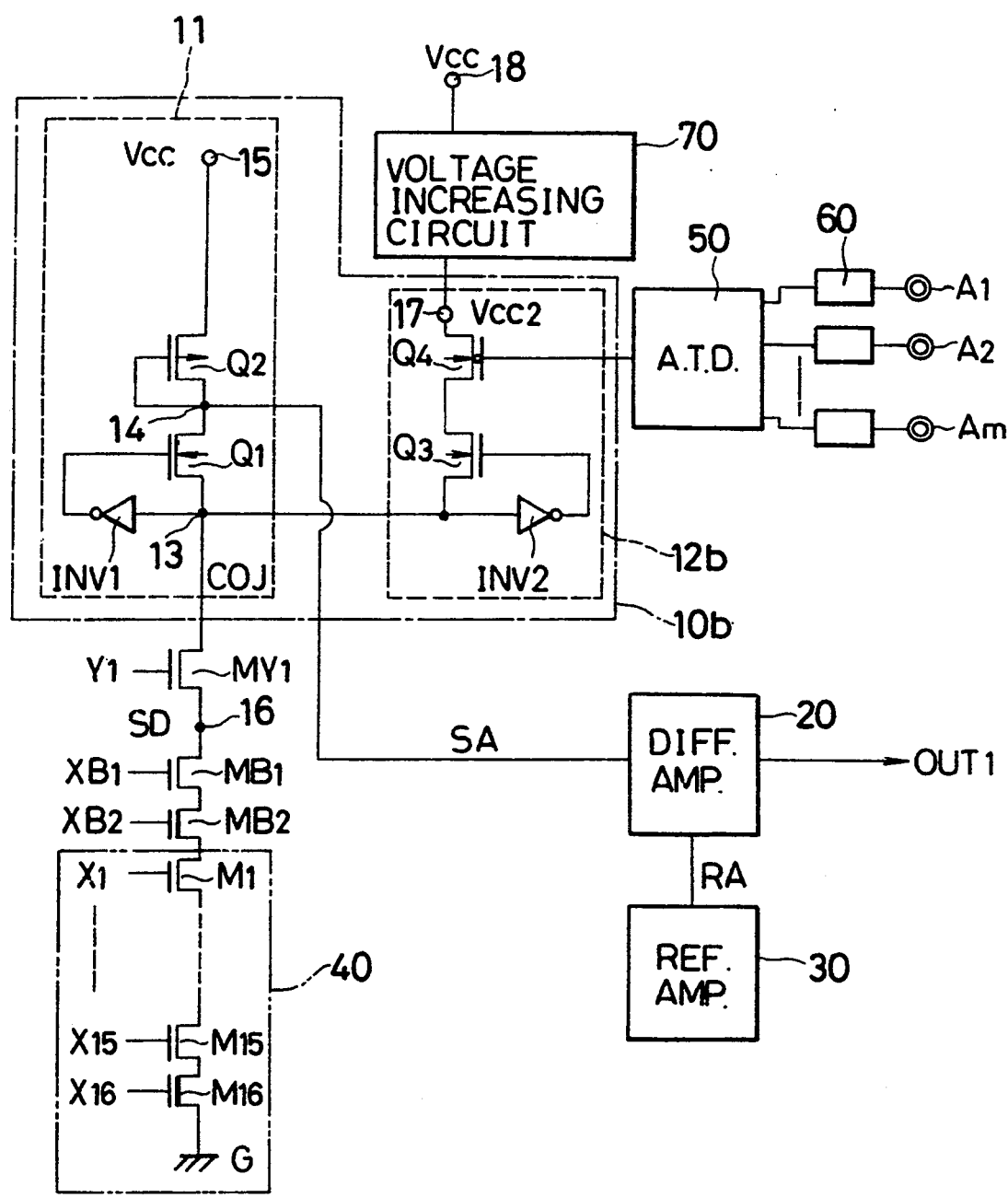
FIG. 7 is a circuit diagram of a semiconductor memory according to a third embodiment of this invention.

FIG. 7 shows a semiconductor memory according to a third embodiment of this invention, in which a sense amplifier 10b has a bias circuit 11 which is similar in structure to that of the first embodiment and a charging circuit 12b which is different in structure from the charging circuit 12 of the first embodiment. The charging circuit 12b is different in structure from that of the first embodiment only in that a power source end 17 of the charging circuit 12b is supplied with a power source voltage Vcc2 larger than the voltage Vcc. Other than the sense amplifier 10b, what is different from the first embodiment is only that a voltage increasing circuit 70 for increasing the power source voltage Vcc is provided between a power source end 18 and the power source end 17.

The sense amplifier 10b is operable similarly to the sense amplifier 10 of the first embodiment, however, because the charging circuit 12b is supplied with the power source voltage Vcc2 larger than the voltage Vcc of the first embodiment, the electric current supplying capacity through the MOSFETs Q4 and Q3 can be further enhanced than that of the first embodiment and as a result, the connecting point 16 can be charged further speedily, thus being advantageously operable faster than the circuit shown in the first embodiment.

In these embodiments mentioned above, explainations were made in relation to a mask read-only memory (mask ROM) of a 16-stage longitudinal arrangement type in which each of the memory cell blocks has 16 memory cells M1 to M16 connected in series, but is not limited thereto. This invention can be applied to various types of mask ROMs including eight-stage, four-stage and two-stage longitudinally arranged memory cell blocks and a one-stage memory cell block. In addition, as a memory cell, an electrically programmable read-only memory (EPROM) cell, an electrically erasable EPROM (Flash EPROM) cell and the like may be employed.

As explained above, a semiconductor memory of each of the above-described embodiments effectively makes it possible to operate a sense amplifier speedily and stably as well as to operate it speedily even if a power source voltage is low when a selected row line due to address change is charged.

What is claimed is:

1. A semiconductor memory comprising a digit line, a plurality of memory cells connected to said digit line, and a sense amplifier for detecting an electric potential of said digit line changed in accordance with information stored in said plurality of memory cells and amplifying said electric potential; wherein, said sense amplifier has a bias circuit and a charging circuit, both for charging said digit line, said bias circuit including;

a first MOSFET having a source connected to said digit line, a second MOSFET provided between a power source and said first MOSFET, said second MOSFET acting as a load of said first MOSFET, and a first inverter having an input end connected to a source of said first MOSFET and an output end connected to a gate of said first MOSFET;

said charging circuit including;

a third MOSFET having a source connected to said source of said first MOSFET, a second inverter having an input end connected to a source of said third MOSFET and an output end connected to a gate of said third MOSFET, and a fourth MOSFET provided between a drain of said third MOSFET and said power source, and fourth MOSFET receiving through its gate an output signal of an address transition detector and detecting an address change to generate a pulse signal;

an input signal being supplied to said sense amplifier through said source of said first MOSFET, an output signal being derived from a connecting point of said first MOSFET and second MOSFET.

2. The semiconductor memory as claimed in claim 1, wherein a fifth MOSFET having an opposite electroconduction type to that of said fourth MOSFET is provided instead of said fourth MOSFET, and a third inverter is provided between said address transition detector and said fifth MOSFET, and a signal obtained by inverting a logical state of said output signal of said address transition detector in said third inverter is applied to a gate of said fifth MOSFET.

3. The semiconductor memory as claimed in claim 1, wherein a voltage increasing circuit is provided and said bias circuit is supplied with a first power source voltage and said charging circuit is supplied with a second power source voltage which is obtained by said voltage increasing circuit and is larger than said first power source voltage.

4. The semiconductor memory as claimed in claim 1, wherein said third MOSFET and fourth MOSFET are of the same electroconduction type.

5. The semiconductor memory as claimed in claim 1, wherein said third MOSFET and fifth MOSFET are of different electroconduction types.

6. The semiconductor memory as claimed in claim 1, wherein said third MOSFET has the same input/output characteristics as those of said first MOSFET.

7. The semiconductor memory as claimed in claim 1, wherein said second inverter has the same input/output characteristics as those of said first inventer.

8. The semiconductor memory as claimed in any one of the claims 1 to 3, wherein a switching operation of said third MOSFET is carried out by said second inventer at the substantially same time as a switching operation of said first MOSFET is done by said first inverter.

9. The semiconductor memory as claimed in claim 1 or 3, wherein said first, third and fourth MOSFETs are enhancement N-channel ones and said second MOSFET is an enhancement P-channel one.

10. The semiconductor memory as claimed in claim 2, wherein said first and third MOSFETs are enhancement N-channel ones and said second and fourth MOSFETs are enhancement P-channel ones.

11. The semiconductor memory as claimed in claim 1, wherein said bias circuit is supplied with a first power source voltage and said charging circuit is supplied with a second power source voltage which is larger in absolute value than said first power source voltage.

* * * * *